(12) United States Patent
Taoka (10) Patent No.: US 8,362,453 B2
(45) Date of Patent: Jan. 29, 2013

(54) RAIN SENSOR

(75) Inventor: Tetsuo Taoka, Tokyo (JP)

(73) Assignee: Niles Co., Ltd., Tokyo (JP)

( * ) Notice: Subject to any disclaimer, the term of this patent is extended or adjusted under 35 U.S.C. 154(b) by 523 days.

(21) Appl. No.: 12/659,086

(22) Filed: Feb. 24, 2010

(65) Prior Publication Data

US 2011/0204206 A1 Aug. 25, 2011

(51) Int. Cl.
*H01J 5/16* (2006.01)
(52) U.S. Cl. ..................... 250/573; 250/227.25
(58) Field of Classification Search .................. 250/573, 250/227.25, 208.1, 214 AL, 214 R, 214.1; 356/239.8, 445
See application file for complete search history.

(56) References Cited

U.S. PATENT DOCUMENTS

| | | | | |
|---|---|---|---|---|
| 6,307,198 B1 * | 10/2001 | Asakura et al. | ........... | 250/227.25 |
| 6,365,908 B1 * | 4/2002 | Waigel et al. | ................. | 250/574 |
| 6,831,288 B1 * | 12/2004 | Schmitt et al. | ................ | 250/573 |
| 2003/0183752 A1 * | 10/2003 | Kobayashi et al. | ......... | 250/222.2 |
| 2004/0178760 A1 * | 9/2004 | Kobayashi et al. | ........... | 318/483 |

* cited by examiner

*Primary Examiner* — Seung C Sohn
(74) *Attorney, Agent, or Firm* — Rader, Fishman & Grauer PLLC (57) ABSTRACT

There is provided a rain sensor capable of adequately detecting raindrops in a captured image. The rain sensor includes: a surface light source 14 which emits light to a windshield G to cause light to be incident on a raindrop detection region T set on the windshield G at a critical angle or more; a camera 15 which is arranged on the optical path of light totally reflected by the detection region T and captures the detection region T; and a detection unit which detects raindrops adhering to the detection region T from contrast in the image captured by the camera 15; the detection unit detects the raindrops adhering to the detection region T based on at least one of the captured image in the detection region T to which light is emitted from the surface light source 14 and the captured image in the detection region T to which light is not emitted from the surface light source 14.

6 Claims, 8 Drawing Sheets

RAIN SENSOR

BACKGROUND OF THE INVENTION

1. Field of the Invention

The present invention relates to a rain sensor.

2. Description of the Related Art

Various rain sensors have been proposed which detect a rainfall based on raindrops adhering to the windshield of a vehicle. A device disclosed in Japanese Patent Application Laid-Open No. 2007-0127595 is employed in the rain sensor to be used as an device for detecting raindrops adhering to a windshield.

The device disclosed in Japanese Patent Application Laid-Open No. 2007-0127595 is configured such that a white member is provided on the surface of a windshield inside a vehicle compartment, the area of the windshield where the white member is provided is picked up by a camera outside the vehicle compartment and the picked up image is processed to detect the raindrops adhering to the windshield from the difference between a white portion and a peripheral landscape reflected by the adhering raindrops.

However, a raindrop can reflect a landscape around a vehicle, in particular, a pure white building. In such a case, the device disclosed in said Japanese Patent Application may not detect the part of the raindrop reflecting the landscape around the vehicle as the raindrop because the part thereof is not different from the white portion in processing the image.

The present invention is directed to enable a raindrop to be adequately detected in a picked-up image.

SUMMARY OF THE INVENTION

According to the present invention, a rain sensor includes: a light emission unit configured to emit light to a raindrop detection region set on a windshield; a camera which is arranged on the optical path of the light totally reflected by the detection region and captures the detection region; and a detection unit configured to detect raindrops adhering to the detection region from contrast in the image captured by the camera; wherein the detection unit detects the raindrops adhering to the detection region based on at least one of the captured image in the detection region to which light is emitted from the light emission unit and the captured image in the detection region to which light is not emitted from the light emission unit.

According to the present invention, the captured image in the detection region to which light is emitted from the light emission unit is totally bright and the captured image in the detection region to which light is not emitted is totally dark. If raindrops adhere to the detection region, only the portion has a brightness which reflects the landscape around the vehicle reflected in the raindrops. Thereby, the portion of the raindrops adhering to the detection region can be discriminated from other portions excluding raindrops based on the contrast therebetween, enabling adequate detection of only raindrops without being affected by the peripheral landscape reflected in the raindrop in detecting raindrops.

DETAILED DESCRIPTION OF THE PREFERRED EMBODIMENTS

Figure 1:
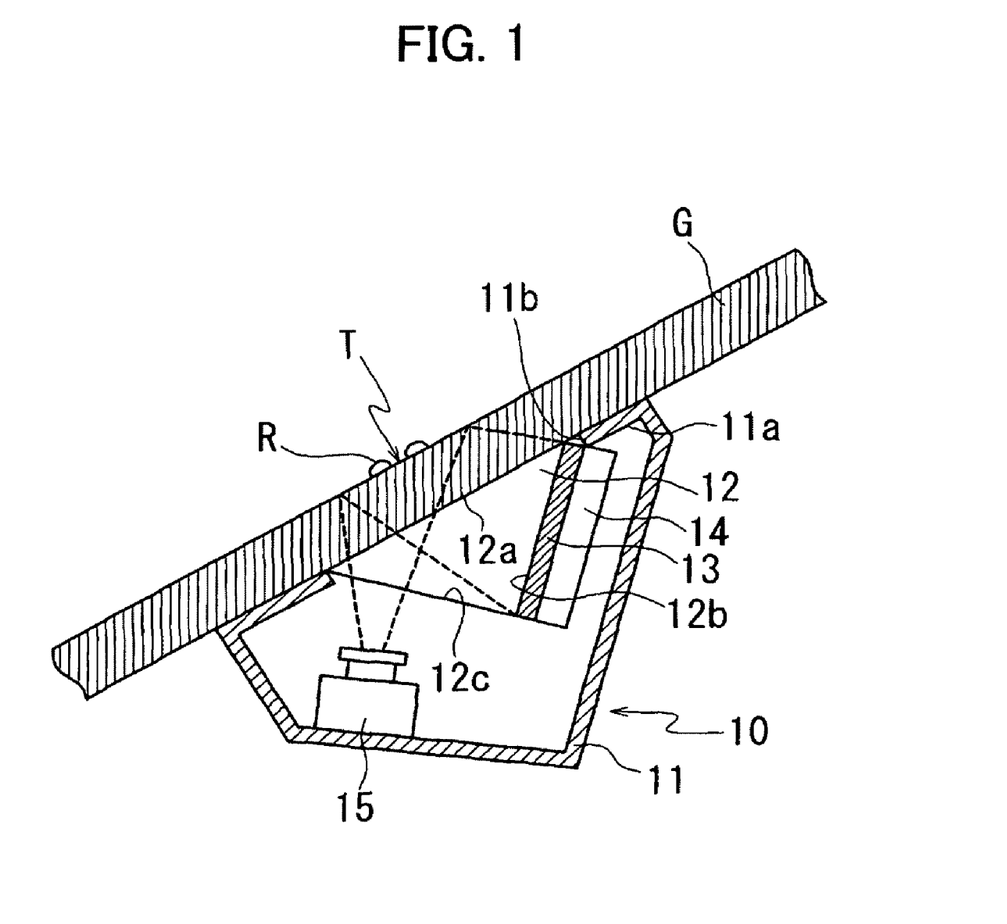
FIG. 1 is a schematic diagram showing a configuration of the rain sensor according to the embodiment.
Figure 2:
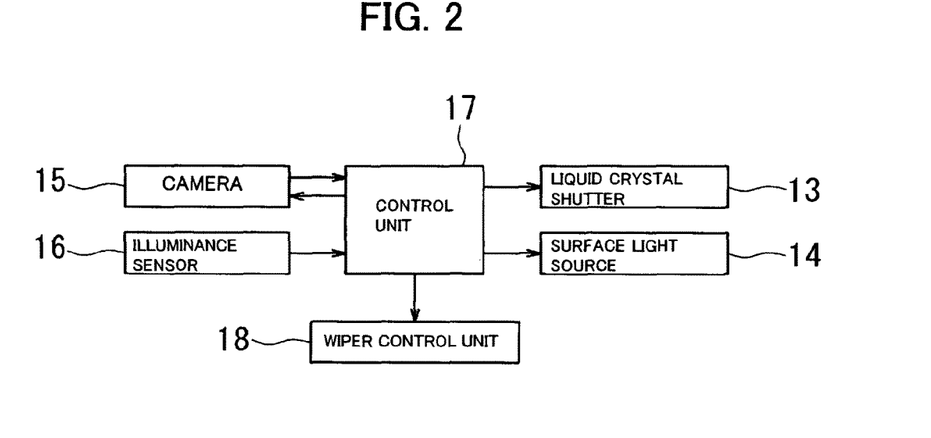
FIG. 2 is a circuit block diagram of the rain sensor.

The embodiment of the present invention is described below. FIG. 1 is a schematic diagram showing a configuration of the rain sensor according to the embodiment and viewed from the cross sectional direction of a windshield to which the rain sensor is attached. FIG. 2 is a circuit block diagram of the rain sensor.

A rain sensor 10 is fixed to the surface of a windshield G on the side of a vehicle compartment with an adhesive (not shown) or an adhesive sheet. A main body case 11 for the rain sensor 10 is formed of a resin material which does not transmit light. The main body case 11 incorporates a rectangular prism 12, a liquid crystal shutter 13, a surface light source 14, and a camera (CCD camera) 15.

The rectangular prism 12 forms an isosceles right triangle, when viewed from the cross section thereof. An opening 11b for exposing the hypotenuse face 12a of the rectangular prism 12 is provided in the front wall 11a of the main body case 11. The hypotenuse face 12a of the rectangular prism 12 is fixed to the surface of the windshield G on the side of the vehicle compartment with an optical transparency adhesive or adhesive sheet which are not shown in the opening 11b of the front wall 11a.

The liquid crystal shutter 13 is provided all over a face 12b among the faces 12b and 12c of the rectangular prism 12 that are orthogonal to each other. The surface light source 14 is provided all over a face of the liquid crystal shutter 13 opposite to the rectangular prism 12 (or the face on the rear side of the vehicle).

The liquid crystal shutter 13 has an open state in which light emitted from the surface light source 14 is transmitted and a closed state in which the light is not transmitted. A control unit 17 (refer to FIG. 2) switches between the open and the closed state of the liquid crystal shutter 13.

The control unit 17 controls turning on or off the surface light source 14. The surface light source 14 emits white light to the rectangular prism 12 when turned on to illuminate a raindrop detection region T defined on the windshield G from the inside of the vehicle compartment.

The surface light source 14 is provided so that light emitted from the surface light source 14 is incident on the detection region T of the windshield G at a critical angle or more and totally reflected by the detection region T. The surface light source 14 is always turned on when the rain sensor is operated. The liquid crystal shutter 13 switches between light emission and no light emission to the detection region T.

The camera 15 is a CCD camera, for example, and arranged in the main body case 11 with the camera 15 being directed toward the 12c of the rectangular prism 12 fixed to the windshield G. The camera 15 is arranged on the optical path of light emitted from the surface light source 14 and totally reflected by the detection region T. The imaging field of the camera 15 is set to a range where the detection region T can be imaged as indicated by the dotted line in the figure. The camera 15 is focused on the detection region T. The camera 15 continuously images the detection region T from the inside of the vehicle compartment and outputs an image data acquired by capturing an image to the control unit 17 while the rain sensor 10 is operating.

As shown in FIG. 2, a signal from an illuminance sensor 16 as well as the image signal captured by the camera 15 are inputted to the control unit 17.

The illuminance sensor 16 is provided in a position where light incident from the upper side of the vehicle can be received to detect a brightness around the vehicle and outputs a signal according to the amount of the received light to the control unit 17.

The control unit 17 is a CPU provided in a printed circuit board (not shown) mounted inside the main body case 11, outputs driving instructions to the liquid crystal shutter 13, the surface light source 14, and the camera 15, and processes the captured image data to obtain the amount of raindrops adhering to the detection region T, determining rainfall. Specifically, the control unit 17 discriminates between the region of the raindrop R adhering to the detection region T and another region (background region) using at least one of the captured image in the detection region T to which light is emitted from the surface light source 14 and the captured image in the detection region T to which light is not emitted from the surface light source 14. The control unit 17 determines rainfall based on the amount of raindrops obtained from the area of region of raindrops occupying the detection region T and outputs the determination result to a wiper control unit 18.

The wiper control unit 18 controls the drive/stop, wiping speed, intermittent time of a wiper (not shown) based on the result of determining rainfall inputted from the control unit 17.

Figure 3:
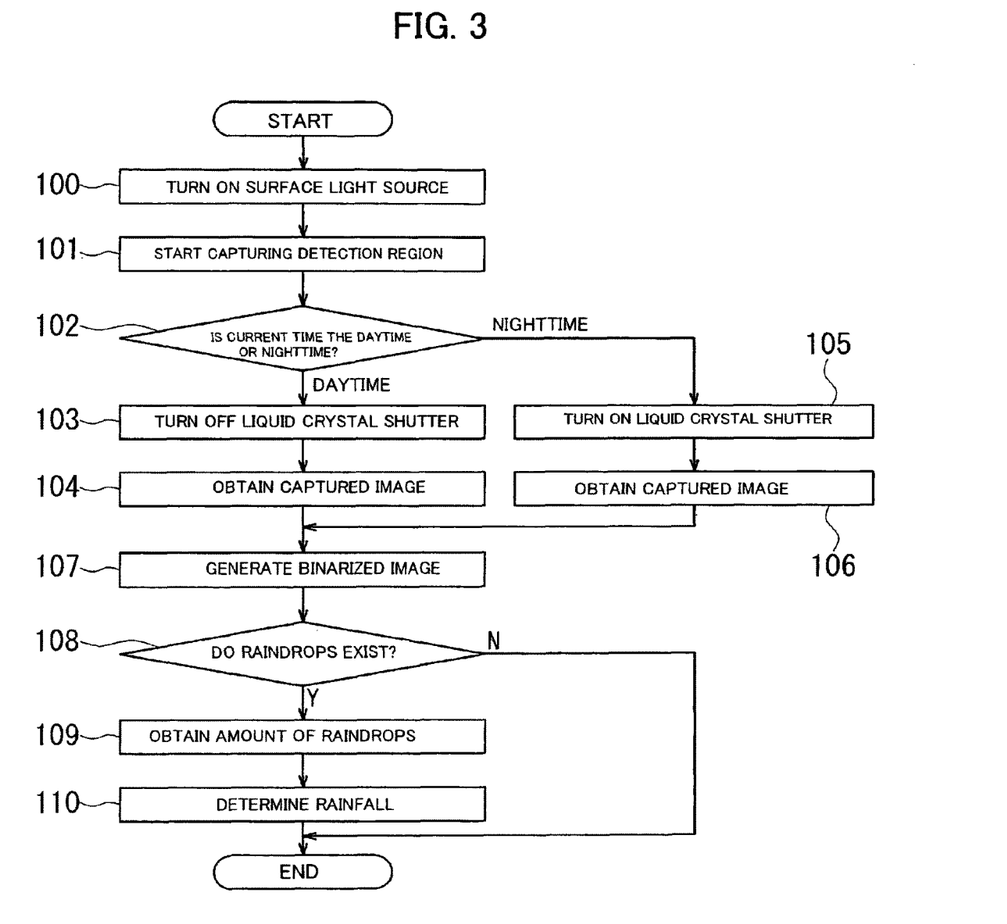
FIG. 3 is a flow chart for describing the process carried out by the control unit of the rain sensor according to the embodiment.
Figure 4:
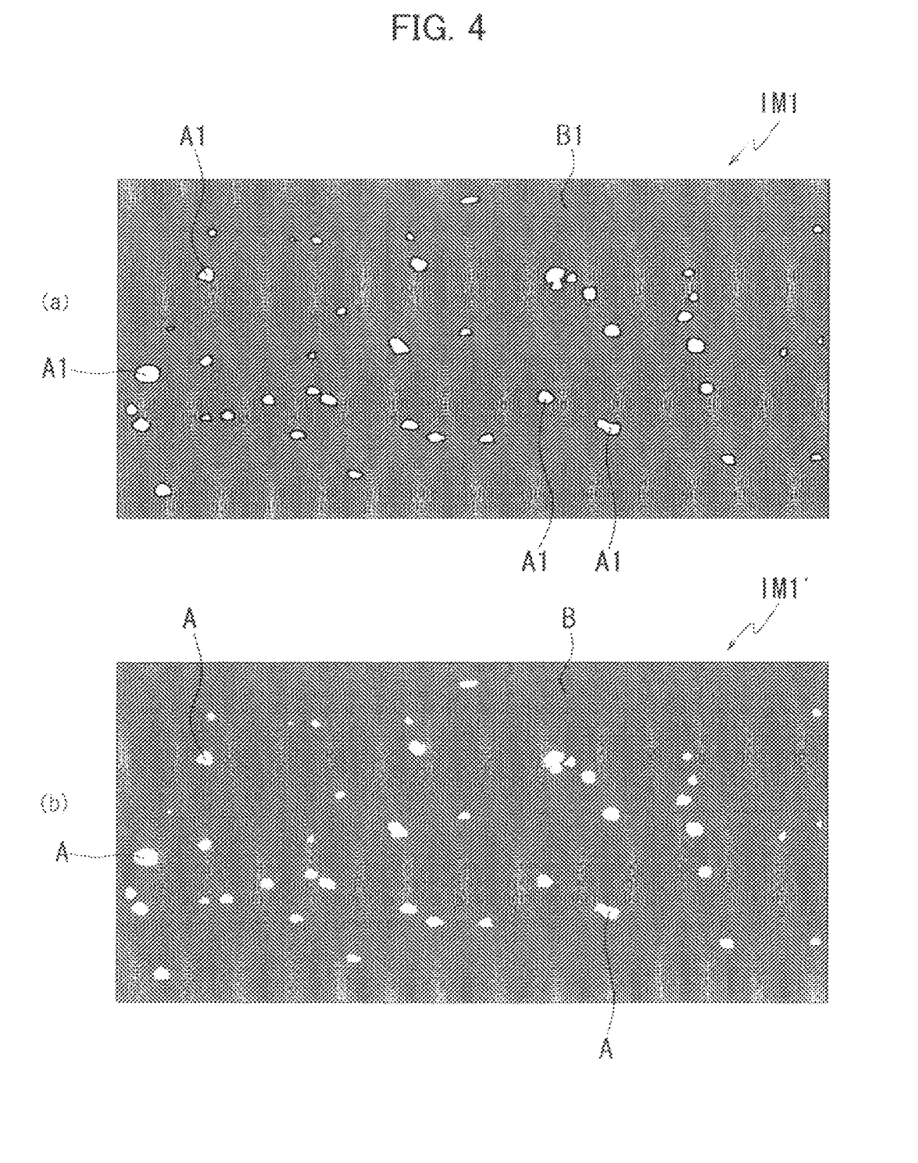
FIG. 4A is a schematic diagram showing the captured image in the detection region to which light is not emitted.
FIG. 4B is a schematic diagram showing a binarized captured-image.
Figure 5:
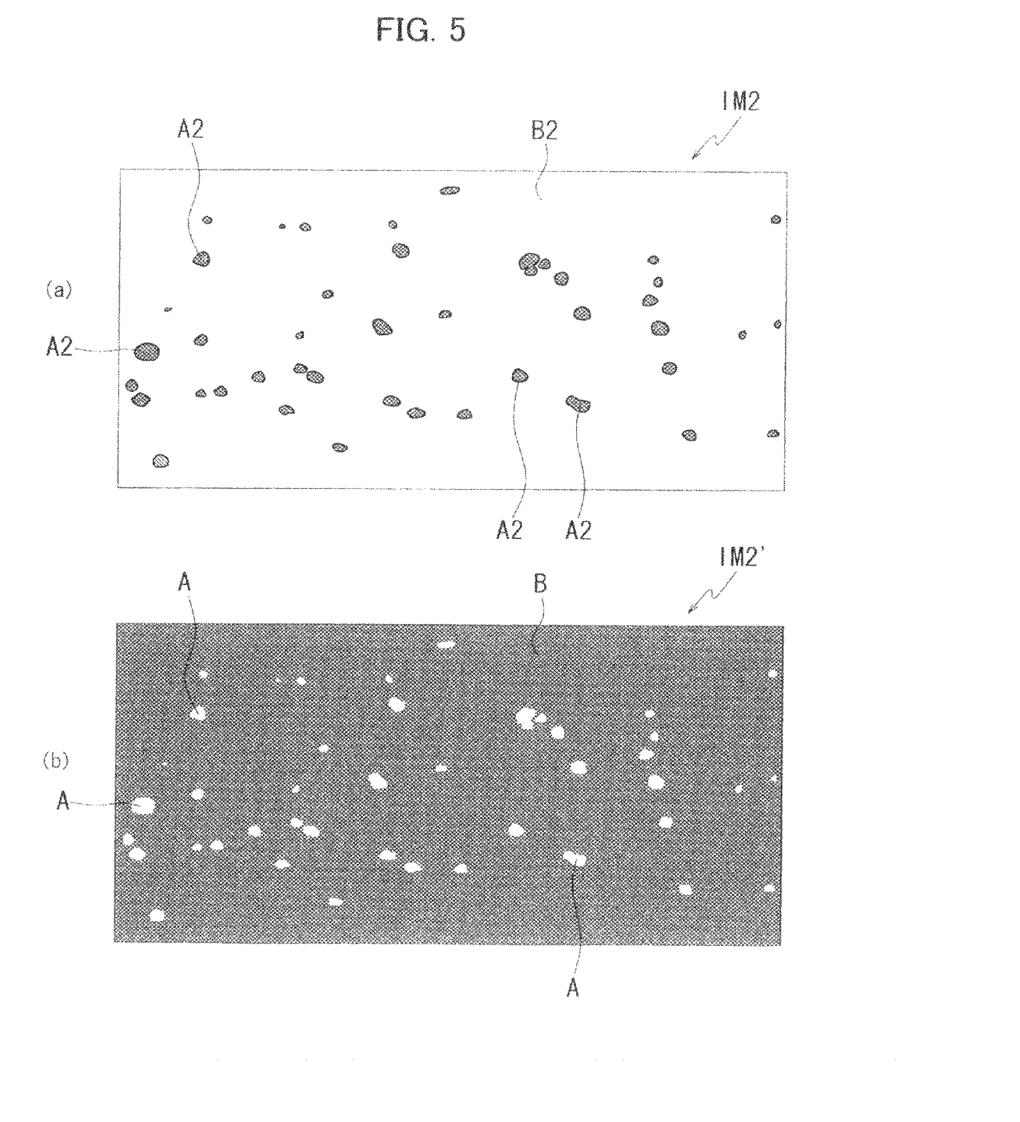
FIG. 5A is a schematic diagram showing the captured image in the detection region to which light is emitted.
FIG. 5B is a schematic diagram showing a binarized captured-image.

The process performed by the control unit 17 is described by a flowchart shown in FIG. 3. FIG. 4A is a schematic diagram showing the captured image in the detection region T to which light is not emitted from the surface light source 14. FIG. 4B is a schematic diagram showing a binarized image shown in FIG. 4A. FIG. 5A is a schematic diagram showing the captured image in the detection region T to which light is emitted from the surface light source 14. FIG. 5B is a schematic diagram showing a binarized image shown in FIG. 5A.

When the rain sensor 10 starts, in step 100, the control unit 17 turns on the surface light source 14 and, in step 101, the camera 15 starts capturing the detection region T.

In step 102, the control unit 17 determines whether the current time is daytime or nighttime based on a signal inputted from the illuminance sensor 16. Specifically, the control unit 17 obtains the brightness (illuminance) around the vehicle based on the signal inputted from the illuminance sensor 16. The control unit 17 determines that the current time is daytime if the obtained illuminance is greater than a threshold value for determining nighttime and that the current time is nighttime if the obtained illuminance is smaller than the threshold value.

In step 102, if the current time is daytime, in step 103, the control unit 17 issues an instruction to the liquid crystal shutter 13 to turn off the liquid crystal shutter 13. Thereby, the background color of the captured image in the detection region T is rendered black.

In step S104, the control unit 17 obtains the image captured in the detection region T while the liquid crystal shutter 13 is being turned off from the captured image data inputted from the camera 15. Specifically, since the captured image data from the camera 15 is continuously inputted to the control unit 17, so that the control unit 17 obtains any one frame of data from the captured image data inputted while the liquid crystal shutter 13 is being turned off to obtain the captured image.

In step 102, if the current time is nighttime, in step 105, the control unit 17 issues an instruction to the liquid crystal shutter 13 to turn on the liquid crystal shutter 13. Thereby, the background color of the captured image in the detection region T is rendered white.

In step 106, the control unit 17 obtains the image captured in the detection region T while the liquid crystal shutter 13 is being turned on from the captured image data inputted from the camera 15.

In step 107, the control unit 17 binarizes the captured image in the detection region T to generate a binarized image in which the portion of a raindrop is shown in white and another portion is shown in black.

The generation of the binarized image is described with the cases of daytime and nighttime separated. First, the generation of the binarized image in daytime is described below. The liquid crystal shutter 13 is turned off in daytime, so that the captured image in the detection region T to which light is not emitted from the surface light source 14 is inputted to the control unit 17. Since the liquid crystal shutter 13 does not transmit light while being turned off, the liquid crystal shutter 13 looks black when the turned-off liquid crystal shutter 13 is viewed from the detection region T. For this reason, the black liquid crystal shutter 13 is reflected in the detection region T viewed from the side of the camera, so that the entire detection region T in the captured image in the detection region T is displayed in black (dark color).

If the raindrop R adheres to the detection region T, a bright daytime landscape is reflected in the raindrop R, so that the portion of the raindrop R is displayed brighter than other portions in the captured image IM1 in the detection region T as shown in FIG. 4A. In the figure, a region B1 is a background region where raindrops do not adhere and the black liquid crystal shutter 13 is reflected. Each region A1 is a region of a raindrop in which a bright daytime landscape is reflected.

The control unit 17 obtains the luminances of pixels forming the captured image IM1 shown in FIG. 4A and compares the obtained luminances with the threshold (threshold for daytime) predetermined to detect raindrops. The control unit 17 generates the binarized data in which a pixel whose luminance is smaller than the threshold is taken as "0" indicating a background region and a pixel whose luminance is greater than the threshold is taken as "1" indicating a raindrop region and generates a binarized image IM1' from the generated binarized data. FIG. 4B shows the state where the binarized image IM1' is generated. The binarized image IM1' shows a raindrop region A in "white" and a background region B excluding raindrops in "black."

The generation of the binarized image in nighttime is described below. The liquid crystal shutter 13 is turned on in nighttime, so that the captured image in the detection region T to which light is emitted from the surface light source 14 is inputted to the control unit 17. The light incident on the rectangular prism 12 from the surface light source 14 is incident on the detection region T of the windshield G at the critical angle or more from the inside of the vehicle compartment and totally reflected. For this reason, the white surface light source 14 is reflected in the detection region T viewed from the side of the camera 15, so that the entire detection region T in the captured image in the detection region T is displayed in white (bright color).

If the raindrop R adheres to the detection region T, a dark nighttime landscape is reflected in the raindrop R, so that the portion of the raindrop R is displayed darker than other portions in the captured image IM2 in the detection region T as shown in FIG. 5A. In the figure, a region B2 is a background region where raindrops do not adhere and the light emitted from the surface light source 14 is reflected and each region A2 is a region of a raindrop where a dark nighttime landscape is reflected.

The control unit 17 obtains the luminances of pixels forming the captured image IM2 shown in FIG. 5A and compares the obtained luminances with the threshold (threshold for nighttime) predetermined to detect raindrops. Where, the predetermined nighttime threshold is greater in luminance than the foregoing daytime threshold (threshold for nighttime>threshold for daytime). The control unit 17 generates the binarized data in which a pixel whose luminance is greater than the threshold is taken as "0" indicating a background region and a pixel whose luminance is smaller than the threshold is taken as "1" indicating a raindrop region and generates a binarized image IM2' from the generated binarized data. FIG. 5B shows the state where the binarized image IM2' is generated. The binarized image IM2' shows a raindrop region A in "white" and a background region B excluding raindrops in "black."

The luminance obtained when light is emitted from the surface light source 14 to the detection region T to which raindrops do not adhere is preferably taken as the threshold (threshold for nighttime) for the case where it is determined that the current time is nighttime. The luminance obtained when light is not emitted from the surface light source 14 to the detection region T to which raindrops do not adhere is preferably taken as the threshold (threshold for daytime) for the case where it is determined that the current time is daytime. Thereby, the portion of raindrops can be accurately discriminated from other portions to which raindrops do not adhere to allow easily and accurately generating binarized data and image.

In step 108 in the flow chart in FIG. 3, the control unit 17 determines whether raindrops exist in the binarized image generated by the process in step 107. Specifically, the control unit 17 confirms whether the white region A indicating the raindrop region exists in the binarized image (IM1' or IM2'). If the white region A exists, the control unit 17 determines that raindrops exist in the detection region T.

In step 108, if the control unit 17 determines that raindrops exist, in step 109, the amount of raindrops is obtained from the area of the portion of raindrops occupying the detection region T.

In step 110, the control unit 17 compares the amount of raindrops obtained in step 109 with the threshold to classify rainfall at the current time into any of the predetermined categories such as "light rain," "rain," and "heavy rain," for example, determining the rainfall.

In step 108, if the control unit 17 determines that raindrops do not exist, the process is ended.

The surface light source 14 in the embodiment corresponds to a light emission unit in the invention. The process in step 102 corresponds to a determination unit in the invention. The process in steps 103 to 108 corresponds to a detection unit in the invention.

As described above, the rain sensor includes: the surface light source 14 which emits light to the raindrop detection region T set on the windshield G to cause light to be incident on the detection region T at a critical angle or more; the camera 15 which is arranged on the optical path of light totally reflected by the detection region T and captures the detection region T; and the detection unit which detects raindrops adhering to the detection region T from contrast in the image captured by the camera 15; the detection unit detects the raindrops adhering to the detection region T based on at least one of the captured image in the detection region T to which light is emitted from the surface light source 14 and the captured image in the detection region T to which light is not emitted from the surface light source 14. The light incident on the detection region T at the critical angle or more is totally reflected, so that the surface light source 14 is reflected in the detection region T viewed from the side of the camera 15 while the liquid crystal shutter 13 is being turned on and the liquid crystal shutter 13 is reflected in the detection region T while the liquid crystal shutter 13 is being turned off. The captured image in the detection region T to which light is emitted from the surface light source 14 is totally bright and the captured image in the detection region T to which light is not emitted is totally dark. If raindrops adhere to the detection region T, only the portion has a brightness which reflects the landscape around the vehicle reflected in the raindrops. The portion of the raindrops adhering to the detection region T can be discriminated from other portions excluding raindrops based on the contrast therebetween, enabling appropriately detecting raindrops. The raindrop adhering to the windshield G can be captured as an image to facilitate image processing, allowing easily calculating the diameter of an adhering raindrop, the number of them, and the rate of region of the raindrops occupying the detection region T (covering ratio).

The rain sensor further includes the determination unit for determining whether the current time is daytime or nighttime based on an output of the illuminance sensor 16. If the determination unit determines that the current time is daytime, the detection unit detects raindrops based on the captured image in the detection region T to which light is not emitted from the surface light source 14. If the determination unit determines that the current time is nighttime, the detection unit detects raindrops based on the captured image in the detection region T to which light is emitted from the surface light source 14. The captured image in the detection region T to which light is emitted from the surface light source 14 is totally bright and the captured image in the detection region T to which light is not emitted is totally dark. If raindrops adhere to the detection region T, the landscape around the vehicle reflected in the raindrops is bright in daytime, but dark in nighttime. For this reason, in daytime, the portion of the raindrop is displayed bright in the captured image in which the entire detection region T is displayed as a dark image. In nighttime, the portion of the raindrop is displayed dark in the captured image in which the entire detection region T is displayed as a bright image. Thereby, the portion of the raindrops adhering to the detection region T can be discriminated from other portions excluding raindrops based on the contrast therebetween, enabling adequate detection of only raindrops without being affected by the peripheral landscape reflected in the raindrop in detecting raindrops. The background color of the captured image is switched between daytime and nighttime according to surrounding circumstances as needed to compare data such as luminance with each other, which can detect raindrops adhering to the windshield G without being affected by peripheral brightness.

If the determination unit determines that the current time is daytime, the detection unit detects an aggregation of pixels whose luminance is greater than a predetermined threshold among the pixels constituting the captured image as a raindrop. If the determination unit determines that the current time is nighttime, the detection unit detects an aggregation of pixels whose luminance is smaller than the predetermined threshold among pixels constituting the captured image as a raindrop. This enables a raindrop to be easily detected only by obtaining the luminance of each pixel in the captured image to compare it with the threshold.

In the embodiment, although the threshold for the case where it is determined that the current time is daytime (threshold for daytime) is made different from the threshold for the case where it is determined that the current time is nighttime (threshold for nighttime), the same threshold may be used.

Figure 6:
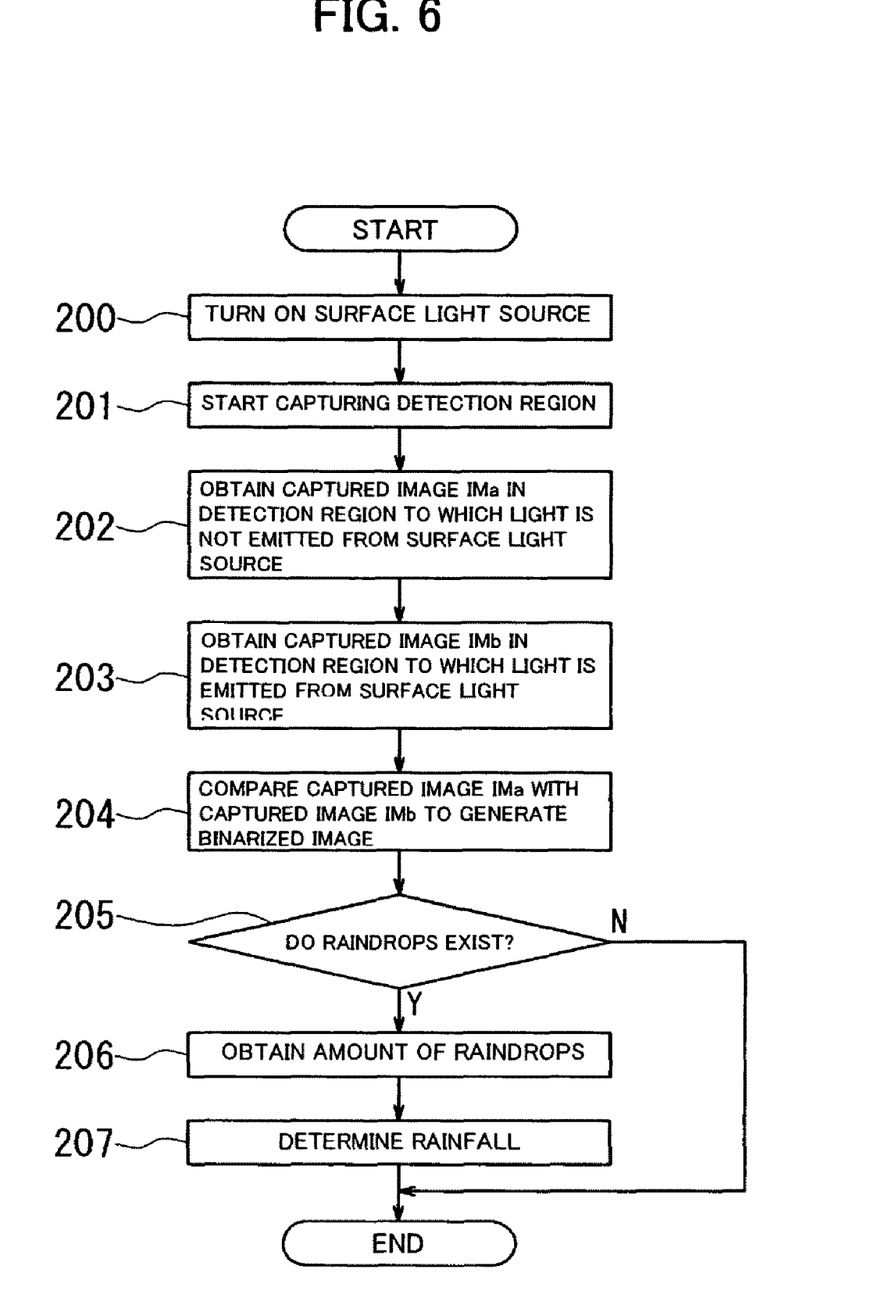
FIG. 6 is a flow chart for describing the modification example of the process carried out by the control unit of the rain sensor.

A modification example of the process carried out by the control unit 17 is described using a flow chart shown in FIG. 6. The process according to the modification example compares the captured image IMb in the detection region T to which light is emitted from the surface light source 14 with the captured image IMa in the detection region T to which light is not emitted from the surface light source 14 to generate the binarized image.

Figure 7:
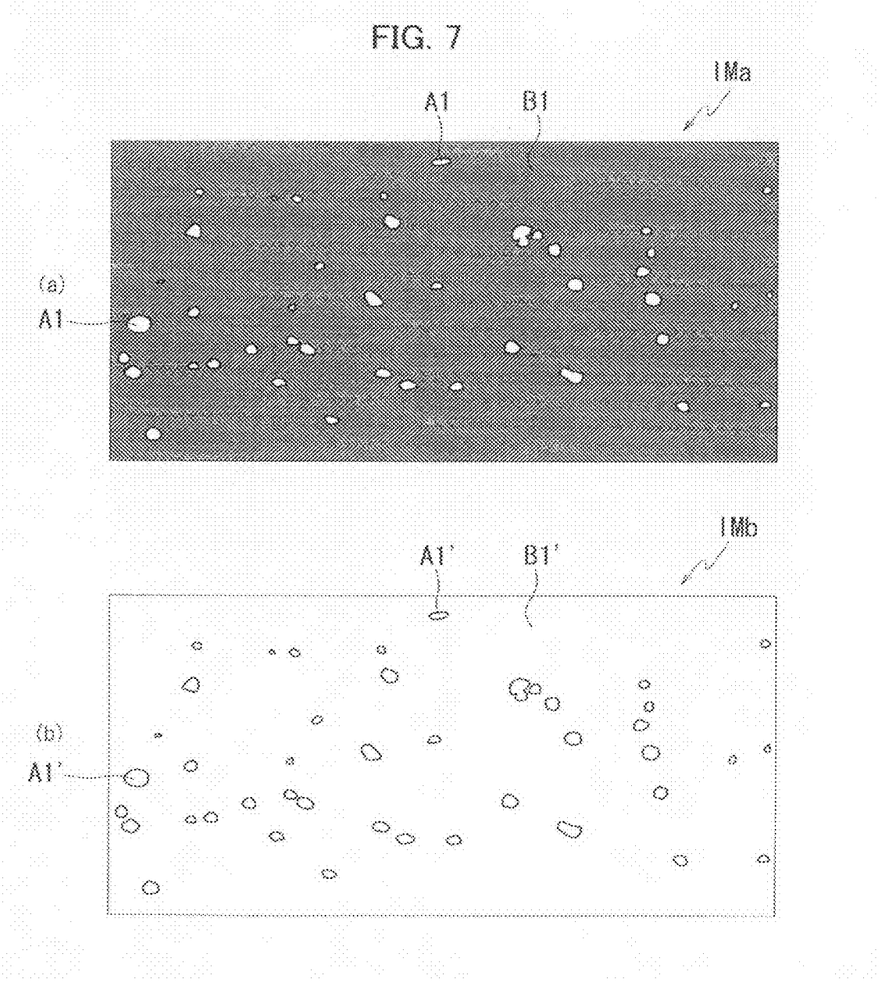
FIG. 7A is a schematic diagram showing the captured image in the detection region to which light is not emitted in daytime.
FIG. 7B is a schematic diagram showing the captured image in the detection region to which light is emitted in daytime.
Figure 8:
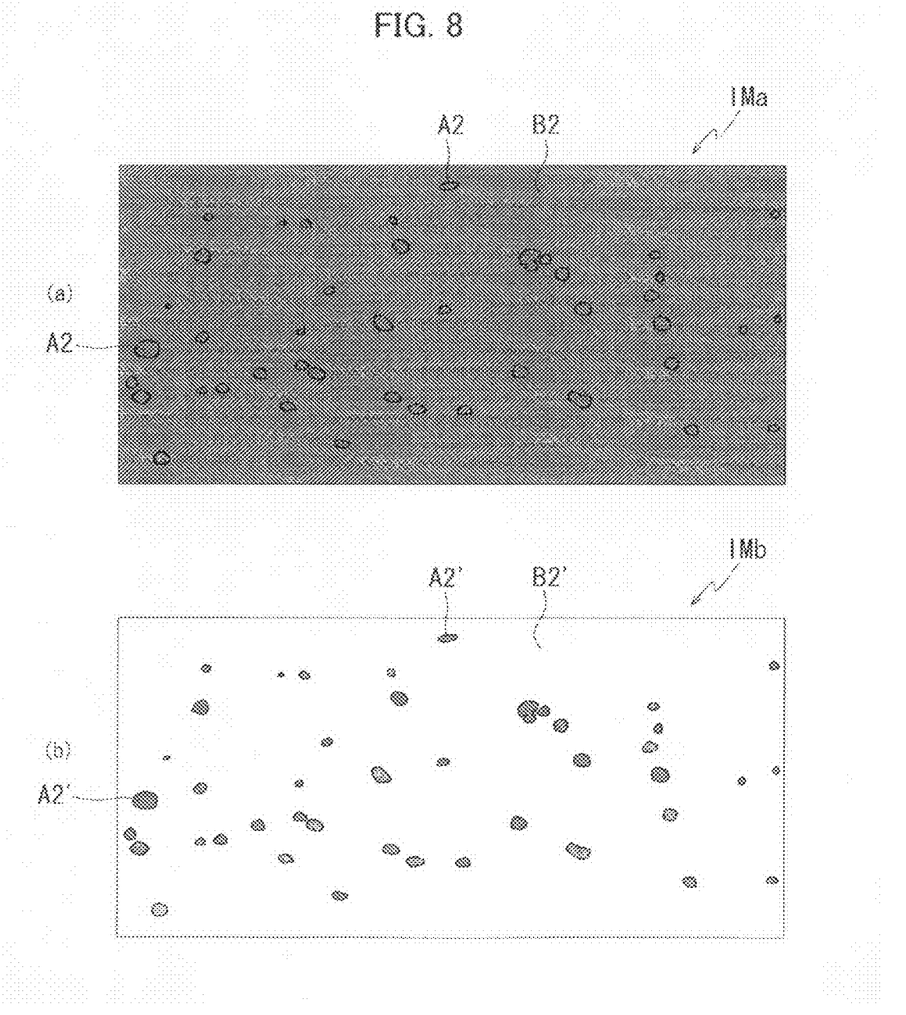
FIG. 8A is a schematic diagram showing the captured image in the detection region to which light is not emitted in nighttime.
FIG. 8B is a schematic diagram showing the captured image in the detection region to which light is emitted in nighttime.

FIGS. 7A and 7B show captured images in the detection region T in daytime. FIG. 7A shows the captured image IMa in the detection region T to which light is not emitted from the surface light source 14. FIG. 7B shows the captured image IMb in the detection region T to which light is emitted from the surface light source 14. FIGS. 8A and 8B show captured images in the detection region T in nighttime. FIG. 8A shows the captured image IMa in the detection region T to which light is not emitted from the surface light source 14. FIG. 8B shows the captured image IMb in the detection region T to which light is emitted from the surface light source 14.

When the rain sensor 10 starts, in step 200, the control unit 17 turns on the surface light source 14 and, in step 201, the camera 15 starts capturing the detection region T.

In step 202, the control unit 17 issues an instruction to the liquid crystal shutter 13 to turn off the liquid crystal shutter 13 and obtains the captured image IMa in the detection region T to which light is not emitted from the surface light source 14 from the captured image data inputted from the camera 15.

In step 203, the control unit 17 issues an instruction to the liquid crystal shutter 13 to turn on the liquid crystal shutter 13 and obtains the captured image IMb in the detection region T to which light is emitted from the surface light source 14 from the captured image data inputted from the camera 15.

In step 204, the control unit 17 compares the captured image IMa with the captured image IMb to generate the binarized image.

The generation of the binarized image is described with the cases of daytime and nighttime separated. For the case of daytime, a bright daytime landscape is reflected in the raindrop adhering to the detection region T. Therefore, as shown in FIG. 7A, the portion to which the raindrop adheres is displayed bright and other portions are displayed dark in the captured image IMa in the detection region T to which light is not emitted from the surface light source 14. In the figure, a region B1 is a background region where raindrops do not adhere and the black liquid crystal shutter 13 is reflected. Each region A1 is a region of a raindrop in which a bright daytime landscape is reflected.

In this state, when light is emitted from the surface light source 14 to the detection region T, the light is totally reflected only by the region except the raindrop. Therefore, as shown in FIG. 7B, only the region except the raindrop is displayed brighter and the brightness of the portion to which the raindrop adheres is not appreciably changed in the captured image IMb in the detection region T to which light is emitted from the surface light source 14. In the figure, a region B1' is the region (background region) except the raindrop to which raindrops do not adhere and light is emitted from the surface light source 14. Each region A1' is a region of a raindrop in which a bright daytime landscape is reflected.

For the case of nighttime, a dark nighttime landscape is reflected in the raindrop adhering to the detection region T. Therefore, as shown in FIG. 8A, both of the portion to which the raindrop adheres and other portions are displayed dark in the captured image IMa in the detection region T to which light is not emitted from the surface light source 14. In the figure, a region B2 is a background region where raindrops do not adhere and the black liquid crystal shutter 13 is reflected. A region A2 is a region of a raindrop in which a dark nighttime landscape is reflected.

In this state, when light is emitted from the surface light source 14 to the detection region T, the light is totally reflected only by the region except the raindrop. Therefore, as shown in FIG. 8B, only the region except the raindrop is displayed bright and the portion to which the raindrop adheres keeps dark and is not appreciably changed in brightness in the captured image IMb in the detection region T to which light is emitted from the surface light source 14. In the figure, a region B2' is the region (background region) except the raindrop to which raindrops do not adhere and light is emitted from the surface light source 14. Each region A2' is a region of a raindrop in which a dark nighttime landscape is reflected.

The luminance of the pixel corresponding to the portion to which the raindrop adheres among the pixels constituting the captured image is not appreciably changed irrespective that light is emitted from the surface light source 14 or not. The control unit 17 compares the luminances of the pixels existing in positions corresponding to each other in the captured image IMa in the detection region T to which light is not emitted from the surface light source 14 and in the captured image IMb in the detection region T to which light is emitted. The control unit 17 generates the binarized data in which a pixel in which the difference between the luminances is smaller than a predetermined threshold is taken as "1" indicating a raindrop region and a pixel in which the difference between the luminances is greater than a predetermined threshold is taken as "0" indicating a background region and generates a binarized image from the generated binarized data. Thus, the binarized image is generated as shown in FIG. 4B of the foregoing embodiment.

In step 108 in the flow chart in FIG. 6, the control unit 17 determines whether raindrops exist. If the control unit 17 determines that raindrops exist, in step 206, the amount of raindrops is calculated, and in step 207, rainfall is determined.

As described above, the detection unit detects raindrops adhering to the detection region T from a contrast between the pixels in the captured image IMa in the detection region T to which light is not emitted from the surface light source 14 and in the captured image IMb in the detection region T to which light is emitted from the surface light source 14. Specifically, the detection unit detects an aggregation of pixels in which the difference between luminances is smaller than a predetermined threshold as the raindrop, the luminances being obtained when light is not emitted and when light is emitted from the surface light source 14. This enables a raindrop to be easily detected only by obtaining the luminance of each pixel in the captured image to compare it with the threshold. Furthermore, there is no need for determining whether the current time is daytime or nighttime, so that the illuminance sensor 16 can be removed. This allows the manufacturing cost of the rain sensor.

The liquid crystal shutter 13 switching between the emission and the non-emission of light to the detection region T is provided between the surface light source 14 and the detection region T. The liquid crystal shutter 13 is excellent in response to enable switching between the emission and the non-emission of light to the detection region T for a short time. Both the captured image IMa in the detection region T to which light is not emitted from the surface light source 14 and the captured image IMb in the detection region T to which light is emitted can be obtained for a short time. Even if raindrops adhering to the detection region T change every second, the raindrops can be adequately detected.

Although the embodiment exemplifies a case where the rectangular prism 12 is fixed to the windshield G with an optical transparency adhesive, the rectangular prism 12 may be pressed and fixed to the windshield G with an optical transparency elastic body such as a rubber adhesive, for example.

In the embodiment, although the control unit determines whether the current time is daytime or nighttime based on the signal input from the illuminance sensor, the control unit may distinguish between daytime and nighttime from the current time specified based on the output (time signal) from a clock provided instead of the illuminance sensor or may distinguish therebetween using both outputs of the illuminance sensor and the clock.

What is claimed is:

1. A rain sensor comprising:
   a light emission unit configured to emit light to a raindrop detection region set on a windshield;
   a camera which is arranged on the optical path of the light totally reflected by the detection region and captures the detection region; and
   a detection unit configured to detect raindrops adhering to the detection region from contrast in the image captured by the camera; wherein
   the detection unit detects the raindrops adhering to the detection region based on at least one of the captured image in the detection region to which light is emitted from the light emission unit and the captured image in the detection region to which light is not emitted from the light emission unit.

2. The rain sensor according to claim 1, further comprising:
   a determination unit configured to determine whether the current time is daytime or nighttime, wherein
   if the determination unit determines that the current time is daytime, the detection unit detects raindrops based on the image captured when light is not emitted from the light emission unit, and if the determination unit determines that the current time is nighttime, the detection unit detects raindrops based on the image captured when light is emitted from the light emission unit.

3. The rain sensor according to claim 2, wherein
   if the determination unit determines that the current time is daytime, the detection unit detects a pixel whose luminance is greater than a predetermined threshold among the pixels constituting the captured image as a raindrop, and if the determination unit determines that the current time is nighttime, the detection unit detects a pixel whose luminance is smaller than the predetermined threshold among pixels constituting the captured image as a raindrop.

4. The rain sensor according to claim 1, wherein
   the detection unit detects raindrops adhering to the detection region from a contrast between the pixels in the image captured when light is not emitted from the light emission unit and in the image captured when light is emitted from the light emission unit.

5. The rain sensor according to claim 4, wherein
   the detection unit detects a pixel in which the difference between luminances is smaller than a predetermined threshold as the raindrop, the luminances being obtained when light is not emitted from the light emission unit and when light is emitted from the light emission unit.

6. The rain sensor according to any one of claims 1 to 5, wherein a liquid crystal shutter configured to switch between the emission and the non-emission of light to the detection region is provided
   between the light emission unit and the detection region.

\* \* \* \* \*